United States Patent [19]
Hoffmann

[11] Patent Number: 4,498,154
[45] Date of Patent: Feb. 5, 1985

[54] MONOLITHICALLY INTEGRATED SEMICONDUCTOR MEMORY

[75] Inventor: Kurt Hoffmann, Taufkirchen, Fed. Rep. of Germany

[73] Assignee: Siemens Aktiengesellschaft, Berlin and Munich, Fed. Rep. of Germany

[21] Appl. No.: 340,781

[22] Filed: Jan. 19, 1982

[30] Foreign Application Priority Data

Jan. 21, 1981 [DE] Fed. Rep. of Germany ....... 3101802

[51] Int. Cl.³ ............................................. G11C 11/24
[52] U.S. Cl. .................................... 365/149; 365/207
[58] Field of Search ............... 365/149, 154, 156, 190, 365/202, 203, 205, 207, 208, 210, 189

[56] References Cited
U.S. PATENT DOCUMENTS 4,118,794 10/1978 Mizuno et al. ...................... 365/149
4,375,086 2/1983 van Velthoven ................... 365/149

OTHER PUBLICATIONS

IEEE Journal of Solid-State Circuits, vol. Sc 7, No. 5, (Oct. 1972), pp. 338–339.

Primary Examiner—Joseph A. Popek
Attorney, Agent, or Firm—Herbert L. Lerner; Laurence A. Greenberg

[57] ABSTRACT

Monolithically integrated semiconductor memory with a matrix of identical storage cells arranged rows and columns in the form of a coordinated MOS field-effect transistors and storage capacitors in the form of an MOS capacitor and wherein, also, a comparator and a comparison cell is formed of one of the storage cells are associated with each matrix column, including a method for bridging over a point of interruption in a course of a bit line extending from one to another of at least two adjacent storage cells of at least one column. The bridging method may be an MOS field-effect transistor having a current-carrying path over which the point of interruption is bridged.

16 Claims, 3 Drawing Figures

MONOLITHICALLY INTEGRATED SEMICONDUCTOR MEMORY

BACKGROUND AND SUMMARY

The invention relates to a monolithically integrated semiconductor memory with a matrix of identical storage cells arranged in rows and columns, in the form of coordinated MOS-field-effect transistors and storage capacitors represented, for example, by MOS capacitors, wherein, also, a comparator and a comparison cell is represented by a storage cell of the aforementioned type, associated with each matrix column.

Memory circuits of this kind are described, for example, in "IEEE Journal of Solid-State Circuits" Vol. SC-7 (October, 1972), Pages 336–340.

In the conventional organization of such dynamically operated write-read memories, bit lines extending parallel to the rows and connected to the storage cells provided in the associated matrix column are provided for each column of the memory matrix, and are connected to the one input of a comparator formed as a bistable flip-flop. The comparison cell is then connected to the second signal input of the comparator.

Both the storage cells as well as the comparison cells are formed as so-called single-transistor memory cells. They are made up accordingly of transfer transistors (usually of the enhancement type), wherein the source or drain, are connected to the corresponding bit line, and the gate thereof is connected to a word line which is associated with the corresponding memory cell (and extends in parallel rows). The drain and the source, respectively, of the transfer or switching transistor is connected to one pole of a storage capacitor which is formed in particular of an MOS capacity, the second pole of which is connected to the reference potential of the circuit. A dummy line is provided for the comparison cell and corresponds to the word lines. It can be addressed simultaneously with the latter, while the source and the drain, respectively, of the transfer transistor thereof is connected to the other information-carrying terminal of the comparator. Otherwise, the circuit of the comparison or dummy cell is similar to that of the single-transistor storage cell.

In the interest of reducing the effect of the bit line capacity on the storage behavior and the operating speed of the matrix memory, the bit line of the individual matrix columns as well as the number of the single-transistor storage cells assigned to the corresponding matrix column will frequently be divided into two halves, wherein one of the halves will be associated with the one end and the other of the halves with the other of the hereinaforementioned signal inputs of the comparator. Each of the two bit line halves is provided with a corresponding comparison cell in the aforedescribed manner, which are then addressed via the gates thereof if an address of a single-transistor storage cell associated with the other bit line half is present.

OBJECTS

It is accordingly an object of the invention to provide a monolithically integrated semiconductor memory providing further possibilities for reducing the influence of the bit line capacity on the operating speed of the matrix memory.

With the foregoing and other objects in view, there is provided, in accordance with the invention, a monolithically integrated semiconductor memory with a matrix of identical storage cells arranged rows and columns in the form of MOS field-effect transistors and associated capacities in the form of an MOS capacitors and wherein, also, a comparator and a comparison cell likewise formed of one of the storage cells is operatively associated with each matrix column, comprising means for bridging over a point of interruption in a course of a bit line extending from one to another of two adjacent storage cells of at least one column, the bridging means being an MOS field-effect transistor having a current-carrying path over which the point of interruption is bridged.

The bit line capacity $C_B$ is a parasitic capacity which has an effect in an adverse sense not only on the operating speed but also on the amplitude of the respective read-out signal. It is therefore also an object of the invention to take the bit line capacity $C_B$ into consideration. It should be noted in this connection that the features of the invention are applicable not only to one bit line but in most cases to all bit lines of the present matrix memory.

According to experience, the effective bit line capacity is greater the farther the storage cell is removed from the comparator, i.e. from the read amplifier. The various embodiments of the invention take this fact into consideration.

In accordance with another feature of the invention, the respective storage capacities of the storage cells located on the side of the interruption point in the bit line remote from the comparator are greater than the respective storage capacities of the storage cells located between the comparator and the interruption point in the bit line.

In accordance with a further feature of the invention, the memory matrix comprises a multiplicity of bit lines having the same number of interruption points and storage cells, mutually corresponding interruption points of the bit lines being disposed parallel to the matrix rows, the MOS field-effect transistors bridging the interruption points being activatable by a common signal.

In accordance with an added feature of the invention, the activation of the MOS field-effect transistors bridging the interruption points in the bit lines is triggerable by addressing each of the storage cells and the comparison cell, respectively, separated by the corresponding interruption point from the respective comparator.

In accordance with an additional feature of the invention, there are provided matrix-controlling row decoders serving to address word lines and dummy lines, respectively, leading to the storage cells and comparison cells, respectively, located on the side of the interruption points remote from the respective comparator, the row decoders having outputs connected via at least one OR-gate for controlling the MOS field-effect transistor, serving as a switching transistor, bridging the interruption points of the bit lines separating the respective storage cells from the respective comparator.

In accordance with again another feature of the invention, all of the transistors in the memory matrix, including the transistors bridging the interruption points of the bit lines are self-latching or self-blocking.

In accordance with again a further feature of the invention, a comparison cell is operatively associated with each interrupted section of the corresponding bit line and has a storage capacity corresponding to the storage capacity of the corresponding storage cells belonging to the respective bit line section.

In accordance with again an added feature of the invention, the comparator has two information-carrying terminals with each of which a corresponding bit line is operatively associated, each of the bit lines being provided, in a mutually identical manner, with the corresponding storage cells, comparison cells and interruption points.

In accordance with again an additional feature of the invention, the two bit lines operatively associated with the terminals of the corresponding comparator extend from the latter in opposite directions.

In accordance with yet another feature of the invention, the bit lines operatively associated with the terminals of the corresponding comparator extend from the latter in the same direction and in mutually parallel relationship.

In accordance with yet a further feature of the invention, the bit lines are separated into sections by at least one interruption point, the corresponding sections together with the respective transistor bridging the interruption point, which are separated from the corresponding comparator, being spaced a greater distance from one another than the respective bit line sections disposed directly at the respective comparators.

In accordance with yet an added feature of the invention, the comparators are arranged geometrically with respect to the pair of bit lines operatively associated therewith so that the respective comparators belonging to corresponding adjacent bit-line pairs are disposed, respectively, at opposite parts of the border of the memory matrix.

In accordance with yet an additional feature of the invention, the storage cells and the comparison cells belonging to corresponding sections of the bit lines formed by the interruption thereof by at least one interruption point, the respective sections being those separated from the respective comparators, are allotted a greater part of the semiconductor surface than are the remaining storage cells and comparison cells.

In accordance with still a further feature of the invention, a storage cell is disposed at each intersection of all of the bit lines with a corresponding word line, and the respective bridging transistors belonging to corresponding bit-line pairs at the respective interruption points of the respective adjacent bit-line pairs being controllably inversely to one another.

In accordance with a concomitant feature of the invention, the bit lines are formed of doped channels at the surface of a silicon chip containing the memory, the interruption points being formed of a corresponding substrate section having a conduction type opposite that of the corresponding channel, and the transistors bridging the corresponding interruption points are so constructed that the corresponding two bit-line sections separated from one another by the interruption point are identical with the respective source and drain of the respective bridging transistor.

Other features which are considered as characteristic for the invention are set forth in the appended claims.

Although the invention is illustrated and described herein as embodied in a monolithically integrated semiconductor memory, it is nevertheless not intended to be limited to the details shown, since various modifications and structural changes may be made therein without departing from the spirit of the invention and within the scope and range of equivalents of the claims.

BRIEF DESCRIPTION OF THE DRAWINGS:

The construction and method of operation of the invention, however, together with additional objects and advantages thereof will be best understood from the following description of specific embodiments when read in connection with the accompanying drawings, in which:

FIG. 1 shows a single bit line with storage capacitors and a comparator;

FIG. 2 shows an embodiment in which the outer part of the bit line BL is equipped with increased storage capacity;

FIG. 3 shows a dynamic write-read memory in which bit lines are extended in parallel with one another.

DETAILED DESCRIPTION

Figure 1:
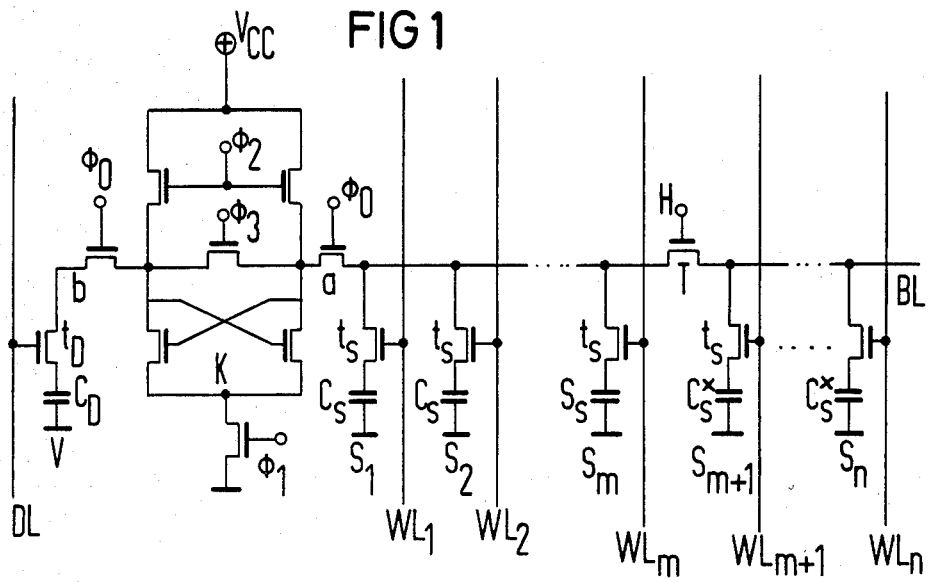
FIGS. 1 to 3 are circuit diagrams of different embodiments of the monolithically integrated semiconductor memory according to the invention.

Referring now to the drawings and first, particularly to FIG. 1 thereof, there is shown a bit line BL interrupted between the m-th storage cell $S_m$ and the following storage cell $S_{m+1}$, and, at the interruption point, a switching transistor T is provided which is of the same type as that of a switching transistor $t_s$ in single-transistor storage cells i.e. predominantly of the n-channel enhancement type. If a proper signal H is present at the gate of the switching transistor T, the latter closes the interruption point and thereby connects to the comparator or read amplifier K and the storage cells $S_{m+1}, \ldots S_n$ which are arranged further away from the comparator or read amplifier K.

If one of the storage cells $S_1$ to $S_m$ is then addressed, the rest of the bit line BL and, accordingly, the storage cells $S_{m+1}, \ldots S_n$, can be separated from the comparator K by appropriate control of the switching transistor T of the respective bit line BL, so that the part of the bit line then determining the addressing is appreciably reduced with respect to the effective bit line capacity $C_B$. The read signal thereby becomes greater than would be the case if the interruption of the bit line BL by the switching transistor T had not become effective.

If, on the other hand, one of the storage cells $S_{m+1}$ to $S_n$ is read out, the bit line section with the storage cells $S_{m+1}$ and so forth disposed away from the comparator K must be reconnected to the read amplifier K by appropriate control of the switching transistor T, so that the increased bit line capacity $C_B$ is effective again.

In order then to achieve an improvement in the read signals here as well, there is proposed in a further embodiment of the invention that the storage capacity $C_S^*$ in the storage cells $S_{m+1}, \ldots S_n$ be made greater than the storage capacity $C_s$ in the inner cells $S_1$ to $S_m$.

It is understandable, that the individual bit lines BL can also have more than one interruption point which can be bridged by a respective switching transistor T. Since the number of storage cells $S_i$ is equal for all matrix columns usually, it will be advantageous to arrange the interruption points and, accordingly, the corresponding transistors T in lines extending parallel to the rows, and to control by a common signal H the switching transistors T belonging to these lines.

In principle, the individual switching transistors T can be realized by a transistor of the enhancement type as well as by a transistor of the depletion type, which, incidentally, applies also to the transistors $t_s$ and $t_D$, respectively, of the storage cells and of the comparison cells V. The use of transistors of the enhancement type, which are produced simultaneously with the other transistors of the memory, has the following advantages in addition to manufacturing advantages:

The bit lines BL are frequently realized by conductor runs formed on the surface of the semiconductor chip containing the memory by suitably shaped doping zones which, simultaneously, form the source regions of the one-transistor storage or memory cells $S_1$, $S_2$, ... associated with the respective bit lines BL. At the individual interruption points, the channel representing the corresponding bit line BL will then be interrupted by a zone of the opposite conduction type (i.e. of the conduction type of the substrate) and the gate electrode of the switching transistor T which is to be provided for bridging the interruption point, will be arranged on a gate oxide layer which is to be provided above the interruption point. The source and drain of this switching transistor T are realized by the parts of the bit line BL which are situated on both sides of the interruption point. The interruption point is then bridged in a conventional manner generally employed with MOS field-effect transistors of the enhancement type when this gate electrode is suitably addressed by a signal.

Each one of the storage cells $S_1$ to $S_n$ of the arrangement shown in FIG. 1 has a transfer or switching transistor $t_s$ to be actuated via the corresponding word line $WL_i$, and a storage capacitor $C_s$ which is connected in series with the respective transistor $t_s$. In the comparison cell V constructed in the same manner, there is a transfer transistor $t_D$ and a storage capacity $C_D$. With the aforementioned possibility for improving the read signals coming from the cells $S_{m+1}$ to $S_n$, the storage capacities $C_s$ are set or adjusted so that they are larger in the cells $S_{m+1}$, ... $S_n$ than in the cells $S_1$ to $S_m$. As a further improvement of the invention, a second comparison cell (not shown in FIG. 1) is advantageously provided in addition to the comparison cell V shown in FIG. 1, the storage capacity $C_D$ of which does not correspond to the storage capacity $C_s$ of the inner storage cells $S_1$ to $S_m$, but to the enlarged storage capacity $C_s^*$ of the outer storage cells $S_{m+1}$ to $S_n$. This additional storage cell is then connected to the comparator K as soon as one of the cells $S_{m+1}$ to $S_n$ is addressed and the bridging transistor T of the respective bit line is conducting.

The comparator K provided as the read amplifier is constructed in conventional manner as a dynamic flip-flop amplifier, the one input a of which is connected to the bit line BL provided with the storage cells $S_1$ to $S_n$, and the other input of which is connected to the comparison cell V and the non-illustrated additional comparison cell having an enlarged storage capacity $C_D^*$, respectively. The corresponding comparison cell V is formed of the transistor $t_D$ and the storage capacity $C_D$ and $C_D^*$, respectively, and is activated via an addressing line DL which is assigned thereto and corresponds to the word lines $WL_1$ to $WL_n$ of the single-transistor storage cells $S_1$ to $S_n$. The signals $\phi_0$, $\phi_1$, $\phi_2$, $\phi_3$ serving for the addressing and activation of the individual parts of the comparator K, as well as the construction of the comparator K, are known, and are in no way specific to the invention. On the contrary, any read amplifier conventional for dynamic memories can be used as the comparator K. Further description of the comparator K is therefore likewise dispensed with.

The addressing of the individual storage cells $S_i$ via the row-parallel word lines $W_i$ is to be so provided that, when storage cells $S_i$ which are separated from the comparator K by one or several interruption points of the corresponding bit line BL, are addressed the corresponding addressed storage cell receives the necessary connection directly to the read amplifier. In other words, the switching transistor T provided between the corresponding addressed storage cell $S_i$ and the comparator K are timely addressed so that the stated interruption points are eliminated.

To this end, for example, the outputs of the decoder serving for row addressing which, in turn, serve for addressing the word lines $WL_{m+1}$ to $WL_n$, can be connected to a corresponding input of an OR-gate, the output of which carries the signal required for controlling the switching transistor T only if one of the storage cells $S_{m+1}$ to $S_n$ is addressed by a signal supplied by the decoder. If, on the other hand, one of the inner word lines $WL_1$ to $WL_m$ is addressed, then no signal appears at the output of the OR-gate (i.e. a logical "0"), so that the outer part of the bit line BL remains separated from the inner part and, thereby, from the comparator K. If several such interruption points per bit line BL are provided, then several such OR-gates can be provided, the OR-gate assigned to the second interruption point as seen from the comparator being controlled as well by the decoder outputs which are associated with the word lines $WL_{n+1}$ to $WL_p$ (where P = the number of the last word line before the second interruption point). The output of this second OR-gate is then provided for controlling both the switching transistor T at the first interruption point as well as the switching transistor T at the second interruption point.

Figure 2:
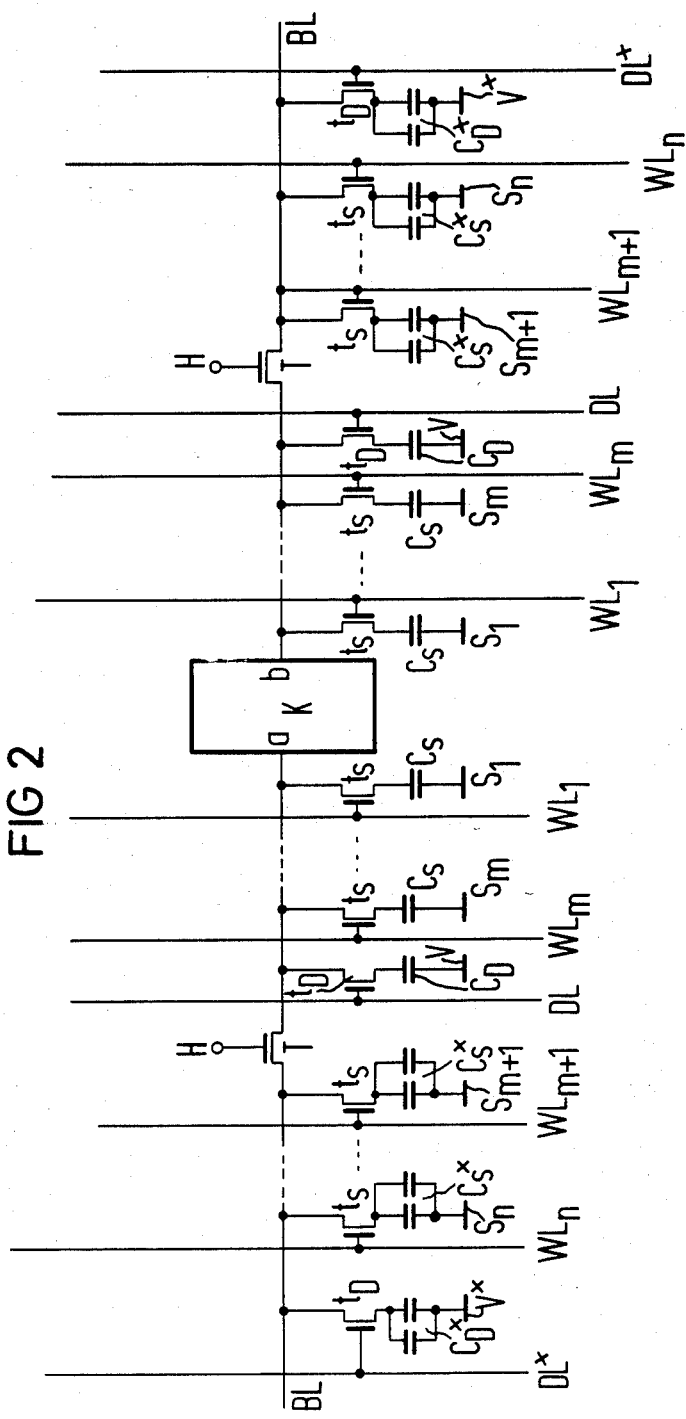

As noted hereinbefore, the provision of storage cells $S_i$ as well as comparison cells V at both information-carrying terminals a and b of the comparator K of the individual matrix columns is state of the Art. A corresponding embodiment of a storage arrangement according to the invention is shown in FIG. 2 wherein the storage capacities $C_s^*$ of the outer storage cells $S_{m+1}$ to $S_n$ are represented symbolically by a parallel connection of two capacitors. It is clear that, in the embodiment according to FIG. 2, the comparison cells V* in the outer parts of the bit line BL, likewise equipped with an increased storage capacity $C_s^*$, are to be activated only by a corresponding drive of the dummy lines DL* respectively assigned to them, so that the embodiment of FIG. 2 provides a simplification with respect to the embodiment according to FIG. 1.

Figure 3:
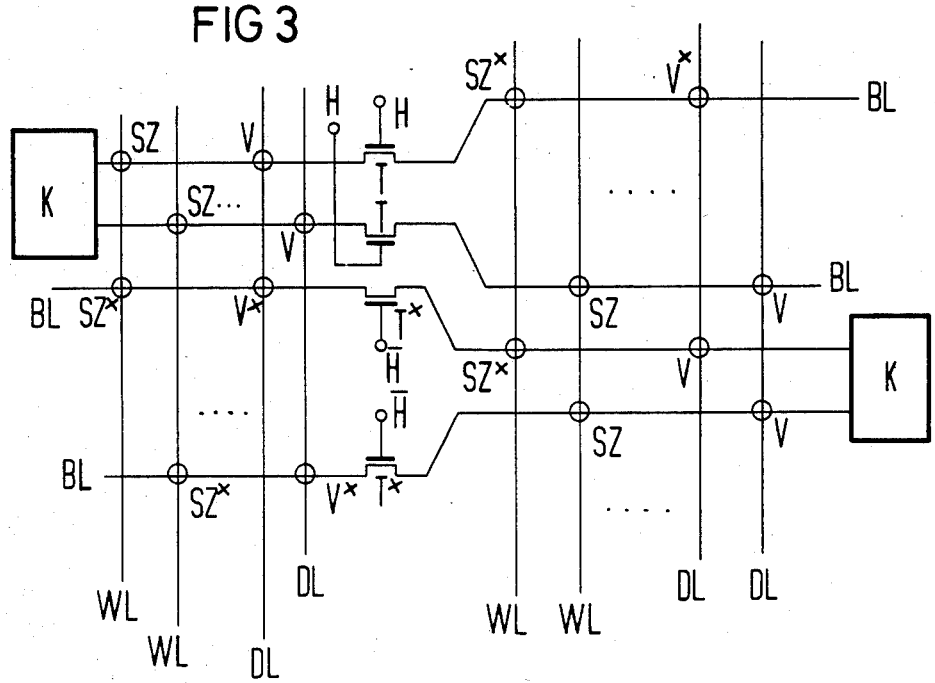

A further improvement of the memory according to the invention is shown in FIG. 3. This possible construction is based on the state of the Art as described in U.S. Pat. No. 4,044,340 and in the literary reference "1980 IEEE International Solid-State Circuits Conference", Pages 228/229. In such memory arrangements, the bit line halves starting from the two signal terminals a and b of the comparator K do not extend mirror-symmetrically to the symmetry line of the comparator circuit diverging as in the arrangement according to FIG. 2, but rather extend parallel to one another and to this symmetry line.

If the subdivision of the bit lines according to the invention is employed in such a memory, it is advisable, as is apparent from FIG. 3, to arrange the comparators K alternatingly along the two row-parallel borders of the memory matrix. This opens up the possibility of providing the storage cells and comparison cells V, respectively, arranged closer to the respectively assigned comparator K, with a smaller storage capacity $C_D$ and therefore smaller chip area, and the cells located in the outer region of all of the bit lines BL with correspondingly larger storage capacity and, therefore, larger chip area, without increasing the space requirement for the overall matrix as compared to the heretofore-known embodiments.

In the embodiment of a dynamic write-read memory shown in FIG. 3, the advance in the Art, in accordance with the invention, does not stem from bit lines arranged contrary to one another but rather from bit lines BL which extend parallel to one another. This arrangement has the advantage that the storage cells $S_1$ to $S_m$ can be provided with a smaller storage capacity $C_s$ and, accordingly, with a smaller chip area, and the other storage cells $S_{m+1}$ to $S_n$ can be provided with a larger storage capacity $C_s^*$ and, consequently, with a larger chip area, without requiring the chip area for the overall matrix to be increased.

The addressing of the bit line pairs arranged adjacent to one another and the comparators belonging thereto is accomplished via the word lines WL and dummy lines DL, respectively. Care must be taken only that the non-addressed bit lines or bit line sections remain switched off. For this reason, the switching transistors located at the corresponding interruption points and belonging to the respective adjacent bit line pairs are addressed by mutually inverted signals. In the illustrated embodiment of FIG. 3, this means that the switching transistors T of the first bit line pair are controlled by a signal H, while the switching transistors T* belonging to the second pair of bit lines are controlled at the interruption points of the two lines BL of the second bit line pair by a signal H which is inverted relative to the control signal H of the first switching transistor pair T. In the illustrated embodiment of FIG. 3, reference characters SZ and SZ*, respectively, are used for the storage cells, and reference characters V and V*, respectively, for the comparison cells, and a relatively simplified embodiment of the invention is provided.

There are claimed:

1. Monolithically integrated semiconductor memory with a matrix of identical storage cells arranged in rows and columns, each storage cell including an MOS field-effect transistor and a storage capacity in the form of an MOS capacitor and wherein also a comparator and a comparison cell identical to one of the storage cells and operatively associated with each matrix row the improvement which comprises means for bridging at least one point of interruption in the path of a bit line extending from one another of at least one adjacent storage cells in each row, said bridging means being an MOS field-effect transistor having a drain and a source and a current-carrying path bridging said at least one point of interruption.

2. Semiconductor memory according to claim 1 wherein the storage capacities of the storage cells located on the side of said point of interruption in the bit line remote from the comparator are greater than the corresponding storage capacities of the storage cells located between the comparator and said point of interruption in the bit line.

3. Semiconductor memory according to claim 1 wherein the memory matrix comprises a multiplicity of said bit lines having the same number of points of interruption and storage cells, mutually corresponding points of interruption of said bit lines being disposed parallel to the matrix rows, the MOS field-effect transistors bridging said interruption points being activatable by a common signal.

4. Semiconductor memory according to claim 3 wherein activation of said MOS field-effect transistors bridging said interruption points in said bit lines are activated by addressng each of the storage cells and the comparison cell, respectively, separated by the corresponding interruption point from the corresponding comparator.

5. Semiconductor memory according to claim 4 including respective matrix-controlling row decoders serving to address word lines and dummy lines, respectively, leading to the storage cells and comparison cells, respectively, located on the side of the interruption points remote from the corresponding comparator, said row decoders having corresponding outputs connected via at least one OR-gate for controlling said MOS field-effect transistor, serving as a switching transistor, bridging said points of interruption of said bit lines separating the corresponding storage cells from the corresponding comparator.

6. Semiconductor memory according to claim 1 wherein said bit lines are formed of doped channels at the surface of a silicon chip containing the memory, said interruption points being formed of a substrate section having a conduction type opposite that of the respective channel, and said transistors bridging the respective interruption points are so constructed that the respective two bit-line sections separated from one another by the corresponding interruption point are identical with the respective source and drain of the corresponding bridging transistor.

7. Monolithically integrated semiconductor memory with a matrix of identical storage cells arranged in rows and columns, each storage cell including an MOS field-effect transistor and a storage capacitor in the form of an MOS capacitor and wherein, also, a comparator and a comparison cell identical to one of the storage cells and operatively associated with each matrix row; the improvement which comprises means for bridging at least one point of interruption in the path of a bit line extending from one to another of at least two adjacent storage cells in each row, said bridging means being an MOS field-effect transistor having a drain and a source and a current-carrying path bridging said at least one point of interruption, and wherein the storage capacitors of the storage cells located on the side of said interruption point in the bit line remote from the comparator are greater than the corresponding storage capacitors of the storage cells located between the comparator and said interruption point in the bit line, and wherein said memory comprises a multiplicity of said bit lines having the same number of interruption points and storage cells, mutually corresponding interruption points and storage cells, mutually corresponding interruption points of said bit lines being disposed parallel to the matrix rows, the MOS field-effect transistors bridging said interruption points being activatable by a common signal, and wherein activation of said MOS field-effect transistors bridging said interruption points in said bit lines are activated by addressing each of the storage cells and the comparison cell, respectively, separated by the corresponding interruption point from the corresponding comparator.

8. Semiconductor memory according to claim 1 wherein all of the transistors in the memory matrix, including said transistors bridging said interruption points of said bit lines are self-latching or self-blocking.

9. Semiconductor memory according to claim 1 wherein a comparison cell is operatively associated with each interrupted section of the corresponding bit line and has a storage capacity corresponding to the storage capacity of the respective storage cells belonging to the respective bit line section.

10. Semiconductor memory according to claim 1 wherein the comparator has two information-carrying terminals with each of which a corresponding bit line is operatively associated, each of said bit lines being provided, in a mutually identical manner, with the respective storage cells, comparison cells and interruption points.

11. Semiconductor memory according to claim 10 wherein the two bit lines operatively associated with said terminals of the corresponding comparator extend from the latter in opposite directions.

12. Semiconductor memory according to claim 10 wherein the bit lines operatively associated with the terminals of the corresponding comparator extend from the latter in the same direction and in mutually parallel relationship.

13. Semiconductor memory according to claim 12 wherein the bit lines are separated into sections by at least one interruption point, the corresponding sections together with the corresponding transistor bridging the interruption point, which are separated from the respective comparator, being spaced a greater distance from one another than the respective bit line sections disposed directly at the respective comparators.

14. Semiconductor memory according to claim 10 wherein the comparators are arranged geometrically with respect to the pair of bit lines operatively associated therewith so that the corresponding comparators belonging to respective adjacent bit-line pairs are disposed, respectively, at opposite parts of the border of the memory matrix.

15. Semiconductor memory according to claim 14 wherein a storage cell is disposed at each intersection of all of said bit lines with a corresponding word line, and the respective bridging transistors belonging to respective bit-line pairs at the respective interruption points of the respective adjacent bit-line pairs being controllable universally in regard to one another.

16. Semiconductor memory according to claim 10 wherein the storage cells and the comparison cells, respectively, belonging to corresponding sections of the bit lines formed by the interruption thereof by at least one interruption point, the respective sections being those separated from the respective comparators, are allotted a greater part of the semiconductor surface than are the remaining storage cells and comparison cells, respectively.

* * * * *